US010763871B1

United States Patent
Patasani et al.

(10) Patent No.: US 10,763,871 B1
(45) Date of Patent: Sep. 1, 2020

(54) APPARATUSES AND METHODS INVOLVING PHASE-ERROR TRACKING CIRCUITS

(71) Applicant: NXP B.V., Eindhoven (NL)

(72) Inventors: Manoj Kumar Patasani, Hamburg (DE); Tarik Saric, Eindhoven (NL); Juan Felipe Osorio Tamayo, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/502,907

(22) Filed: Jul. 3, 2019

(51) Int. Cl.
| | | |
|---|---|---|
| *H03L 7/087* | (2006.01) | |
| *H03L 7/23* | (2006.01) | |
| *H03L 7/113* | (2006.01) | |
| *H03C 3/09* | (2006.01) | |
| *H04L 27/12* | (2006.01) | |
| *H03L 7/187* | (2006.01) | |

(52) U.S. Cl.
CPC ............ *H03L 7/235* (2013.01); *H03C 3/095* (2013.01); *H03C 3/0941* (2013.01); *H03L 7/087* (2013.01); *H03L 7/113* (2013.01); *H03L 7/187* (2013.01); *H04L 27/12* (2013.01)

(58) Field of Classification Search
CPC ......... H04L 27/12; H03L 7/235; H03L 7/087; H03L 7/113; H03L 7/187; H03C 3/0941; H03C 3/095
See application file for complete search history.

(56) References Cited

U.S. PATENT DOCUMENTS

| | | | | |
|---|---|---|---|---|
| 6,483,361 | B1 * | 11/2002 | Chiu | .................... H03L 7/0891 327/157 |
| 10,530,373 | B1 * | 1/2020 | Fridi | ...................... H03L 7/093 |
| 2010/0020910 | A1 * | 1/2010 | Bhagavatheeswaran | .................... H03L 7/0891 375/376 |
| 2013/0300467 | A1 * | 11/2013 | Eldredge | ................. H03L 7/081 327/156 |
| 2015/0145567 | A1 * | 5/2015 | Perrott | .................. G04F 10/005 327/156 |

OTHER PUBLICATIONS

Built-in Self-Test for stability measurement of low-dropout regulator, Jae Woong Jeong, Ender Yilmaz, LeRoy Winemberg, Sule Ozev, International Test Conference 2017, paper 1.4, in print.
Wide Bandwidth System Identification of AC System Impedances by Applying Perturbations to an Existing Converter, Daniel Martin, Enrico Santi, Adam Barkley, 2011 IEEE Energy Conversion Congress and Exposition, p. 2549-2556.

(Continued)

*Primary Examiner* — Ted M Wang
(74) *Attorney, Agent, or Firm* — Rajeev Madnawat

(57) ABSTRACT

Embodiments are directed to apparatuses and methods involving a phase-error tracking circuit. An example apparatus includes a divide-by phase locked loop (PLL) circuit to generate a continuous wave signal that sweeps over a frequency range in response to a divider feedback signal and to a reference signal. The apparatus further includes the phase-error tracking circuit defining a phase-error window in which the divide-by PLL circuit is to lock based on a slope associated with a rate of change of the frequency range, and indicating whether a phase error between the divider feedback signal and the reference signal coincides with the phase-error window.

20 Claims, 9 Drawing Sheets

(56) References Cited

OTHER PUBLICATIONS

Disturbance-free BIST for Loop Characterization of DC-DC Buck Converters, Navankur Beohar; Priyanka Bakliwal; Sidhanto Roy; Debashis Mandal; Philippe Adell; Bert Vermeire; Bertan Bakkaloglu; Sule Ozev, 2015 IEEE 33rd VLSI Test Symposium (VTS), p. 1-6.
Melikyan, V. et al. "Digital Lock Detector for PLL", Proceedings of IEEE East-West Design & Test Symposium, 2 pgs. (Oct. 2008).
Stensby, J. "A New Type of Lock Detector for Phase Locked Loops", IEEE Proceedings. The Twenty-Second Southeastern Symposium on System Theory, 5 pgs., (Mar. 1990).

\* cited by examiner

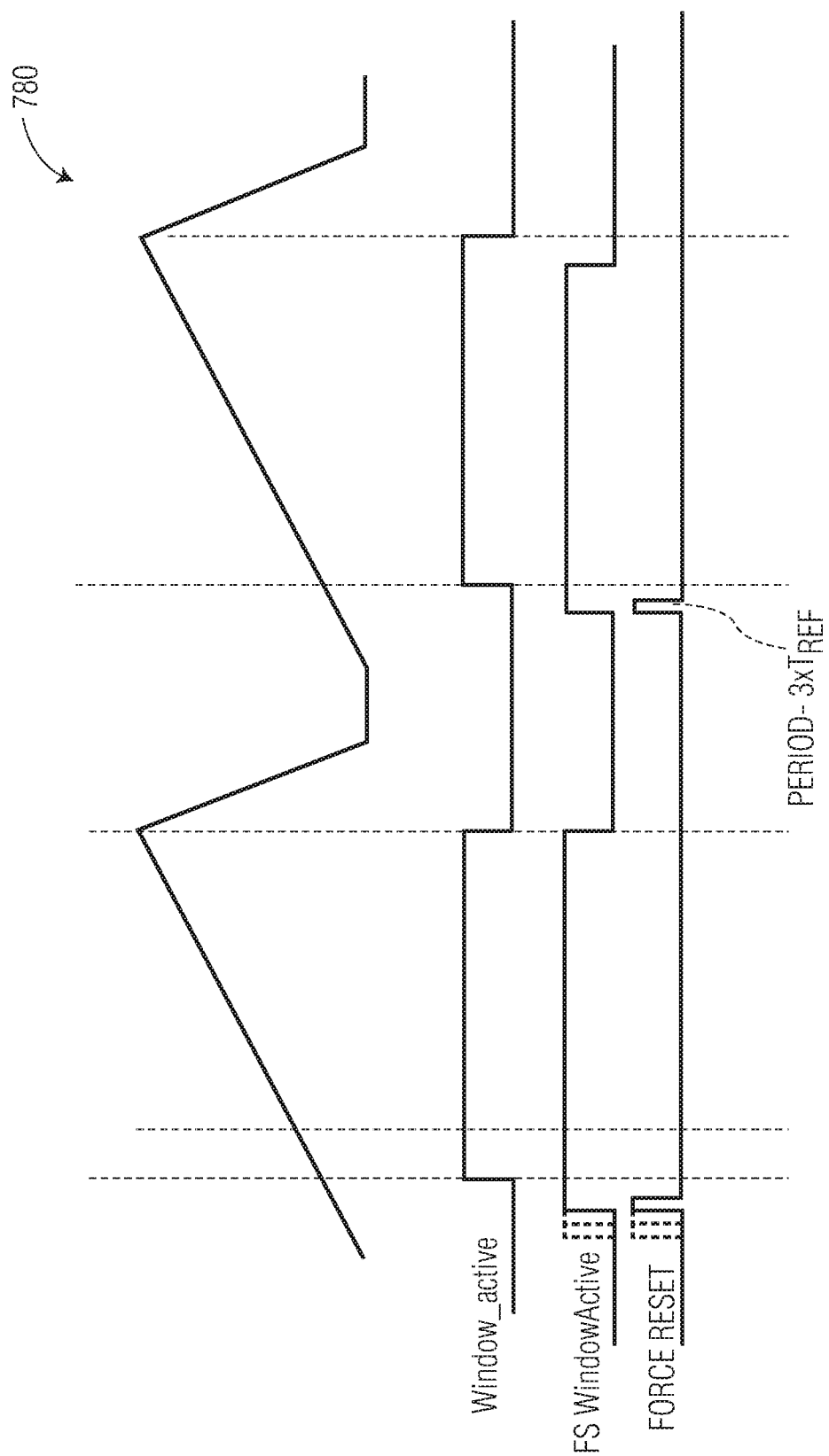

APPARATUSES AND METHODS INVOLVING PHASE-ERROR TRACKING CIRCUITS

OVERVIEW

Aspects of various embodiments are directed to apparatuses and methods related to phase-error tracking circuits.

For many applications, such as automotive radar systems, a frequency-modulated continuous wave (FMCW) is generated using a phase locked loop (PLL) circuit. The PLL circuit ensures that the reference phase and phase of the feedback signal are aligned. In some instances, reference phase and phase of the feedback signal are aligned around an arbitrary value.

These and other matters have presented challenges to efficiencies of phase error tracking of phase locked loop circuit implementations, for a variety of applications.

SUMMARY

Various example embodiments are directed to issues such as those addressed above and/or others which may become apparent from the following disclosure concerning phase-error tracking for a phase locked loop (PLL) circuit.

In certain example embodiments, aspects of the present disclosure involve a phase-error tracking circuit that defines a phase-error window in which the divide-by PLL circuit is to lock based on a slope associated with a rate of change of the frequency range, and indicates whether a phase error between the divider feedback signal and the reference signal coincides with the phase-error window.

In a more specific example embodiment, an apparatus includes the divide-by PLL circuit and the phase-error tracking circuit. The divide-by PLL circuit generate a continuous wave signal that sweeps over a frequency range in response to a divider feedback signal and to a reference signal. For example, and as further described herein, the divide-by PLL circuit divides an oscillator signal that is equal to fosc=N×fref, where N is the divide by signal, fractional signal (fractional PLL) and fref is a fixed signal. By sweeping division ratio N, fosc follows before the divide-by PLL to ensure the phase lock between the divider feedback signal and the reference signal is maintained. The phase-error tracking circuit defines a phase-error window in which the divide-by PLL circuit is to lock based on a slope associated with a rate of change of the frequency range, and indicates whether a phase error between the divider feedback signal and the reference signal coincides with the phase-error window. The phase-error tracking circuit is to sense the slope associated with a rate of change of the frequency range and/or the phase-error window can be insensitive to whether respective duty cycles of the divider feedback signal and the reference signal coincide. In specific examples, the divide-by PLL circuit and the phase-error tracking circuit are part of a frequency-modulated continuous wave (FMCW) radar device for detecting objects by radar signals based on the continuous wave signal reflecting from the objects. The apparatus can further include a configuration circuit to program at least one limit defining an extremity of the phase-error window.

The divide-by PLL circuit can include a sweep frequency signal generator (e.g., sweep control), a sigma delta modulator, and a divider circuit. The sweep frequency signal generator modulates a wave signal and/or generates an FMCW radar signal, and the sigma delta modulator drives the divider circuit. The output of the divider circuit is used as the divider feedback signal. The divide-by PLL circuit further includes a phase frequency detector (PFD) that responds to the reference signal and to the divider feedback signal and a charge pump that responds to an up signal and a down signal provided or derived from the PFD for indicating a frequency direction in a path of the divide-by PLL circuit. Additionally, the divide-by PLL circuit includes a charge pump that responds to a direction signal, such as from the PFD, for indicating a frequency direction in the path of the divide-by PLL circuit. For example, the divide-by PLL circuit includes the charge pump and a voltage controlled oscillator (VCO) that responds to the charge pump by generating an FMCW radar signal which oscillates at a rate equal to the frequency of the reference signal multiplied by a signal output by the sweep frequency signal generator. More specifically, sweep control defines division ratio sweep results in constant phase offset of divide feedback signal compared to reference signal. The charge pump responds to this phase difference, translating phase difference to variation in input voltage of VCO resulting in FMCW radar signal being generated by the VCO.

In various specific aspects, the sweep frequency signal generator can generate an FMCW radar signal and a control signal (e.g., force-reset). The phase-error tracking circuit uses the control signal as a circuit reset or restart signal. In other aspects and/or in addition, the phase-error tracking circuit uses the directional signal for providing a signal which corresponds to a higher part of the chirp slope, and for causing reset circuitry to reset the phase-error tracking circuit. As further described herein, the phase error-tracking circuit can include phase-error circuitry and/or other circuitry.

Other specific example aspects are directed to an apparatus for use with a radar system having a divide-by PLL circuit to generate a continuous wave signal that sweeps over a frequency range in response to a divider feedback signal and a reference signal. The apparatus includes phase-error circuitry to define a phase-error window in which the PLL circuit is to lock based on a slope associated with a rate of change of the frequency range and circuitry to indicate whether a phase error between the divider feedback signal and the reference signal coincides with the phase-error window. The phase-error circuitry and the circuitry can be integrated together forming lock detection logic.

The circuitry can indicate a phase difference between the reference and divider feedback signals, the phase difference being proportional to an intended frequency rate of change of an FMCW signal output from the PLL circuit. Further, the circuitry indicates if a phase difference between the reference and divider feedback signals coincides with the phase-error window. In various aspects, the phase-error circuitry includes delay circuitry to define the phase-error window in response to the divider feedback signal and the reference signal provided from the divide-by PLL circuit.

In other specific example aspects, the apparatus further includes the above-described divide-by PLL circuit. Further and/or alternatively, the apparatus includes reset circuitry to receive the divider feedback signal and the reference signal and an indication of a frequency direction in a path of the divide-by PLL circuit, and in response, to reset the phase-error circuitry and to define window polarity.

Various specific embodiments are directed to methods of using the above-described apparatuses. An example method includes, in a divide-by PLL circuit, generating a continuous wave signal that sweeps over a frequency range in response to a divider feedback signal and to a reference signal. The method further includes tracking a phase-error between the divider feedback signal and the reference signal by defining a phase-error window in which the PLL circuit is to lock based on a slope associated with a rate of change of the frequency range, and by indicating whether a phase error between the divider signal and the reference signal coincides with the phase-error window. The step of phase-error tracking is to sense the slope associated with a rate of change of the frequency range.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIG. 7 illustrates an example timing diagram for resetting the phase-error tracking circuit, in accordance with various embodiments.

Figure 1:
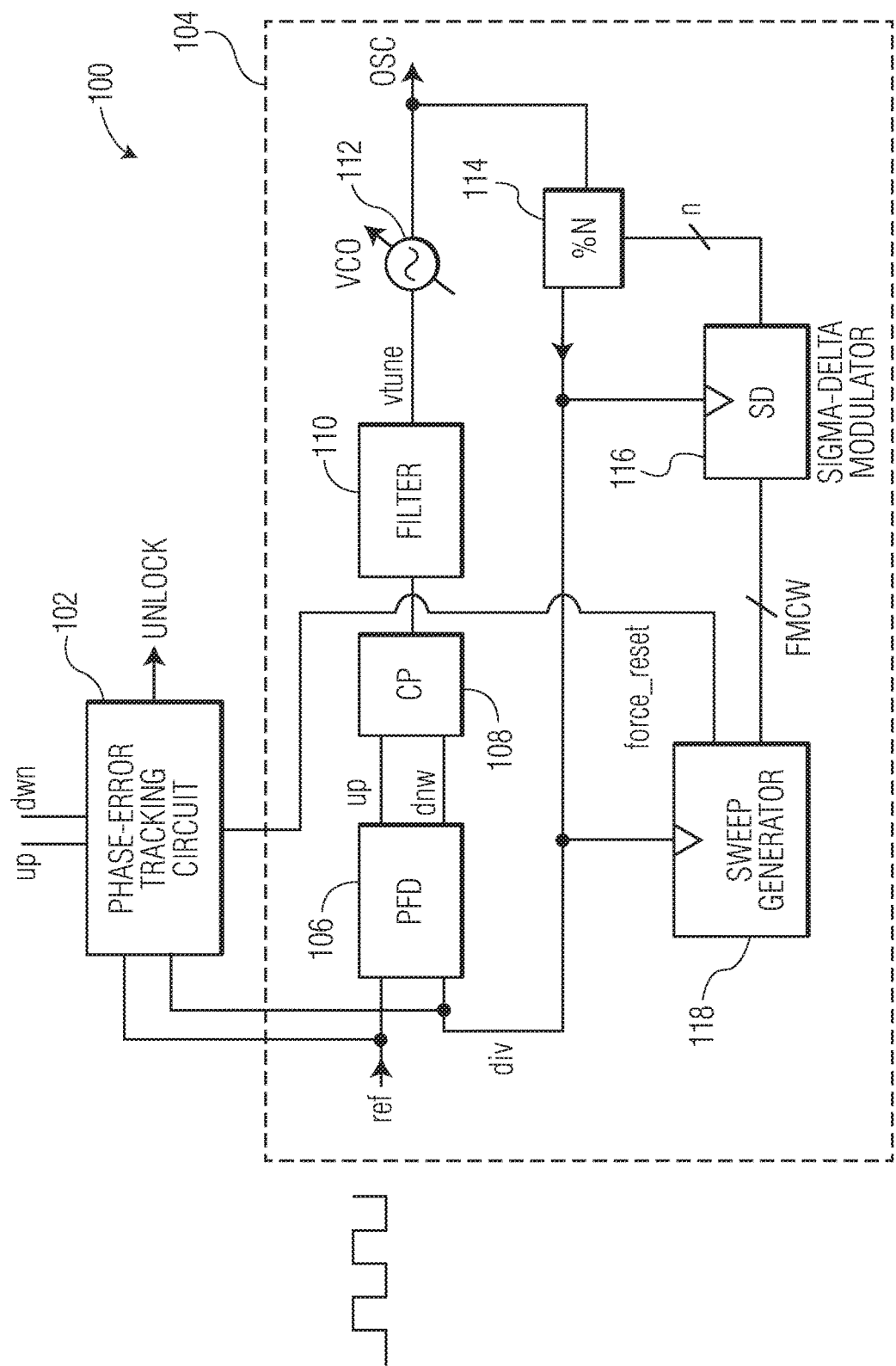
FIG. 1 illustrates an example apparatus for phase-error tracking a PLL circuit, in accordance with various embodiments.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving phase-error tracking circuits. In certain implementations, aspects of the present disclosure have been shown to be beneficial when used in the context of divide-by phase locked loop (PLL) circuit that generates a wave signal which sweeps over a frequency range responsive to a divider feedback signal and a reference signal and the phase-error tracking circuit defining a phase-error window in which the PLL circuit is to lock based on a slope indicative of a rate of change of the frequency range. In some embodiments, the phase-error tracking circuit indicates whether a phase error between the divider feedback signal and the reference signal is within the defined phase error window. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

For various applications, such as an automotive radar application, frequency-modulated continuous wave (FMCW) signals can be implemented using a PLL circuit. The PLL circuit may ensure that a phase of the reference signal, sometimes herein referred to as a "reference phase", and a phase of a feedback signal are aligned. Once the phases are aligned, the PLL is in lock. In accordance with various embodiments, a phase-error tracking circuit is included in or coupled to the PLL circuit to determine whether the reference signal and feedback signal phases are within a particular phase-error window. When or in response to the phase difference being outside the phase-error window, the phase-error-tracking circuit provides an indication that the PLL is not in lock, or is unlocked, and which depends on the window size. For example, assume the phase offset is at twenty percent of charge pump dynamic range, if the windows are set at ten percent and thirty percent and the phase goes beyond such limits, the PLL circuit is not necessarily not in lock. This indicates that something in the loop is not as expected, such as the charge pump current not being what it should be which results in a lower loop gain of the divide-by PLL and bigger phase error. Embodiments in accordance with the present disclosure are directed to a phase-error tracking circuit that can define the phase-error window in which the divide-by PLL circuit is to lock based on a slope associated with a rate of change of the frequency range over which the FWCW signal sweeps, and indicates whether the phase error between the feedback signal and the reference signal is within or outside the defined phase-error window. This slope can be referred to as the "signal slope" for ease of reference. In many instances, the FMCW or other type of continuous wave signal may have a phase difference between the reference and feedback signals that is not zero. By defining the phase-error window based on the signal slope, the phase-error tracking circuit can indicate if the phase difference at the input of the PLL is around an arbitrary or non-zero value.

A number of embodiments are directed to an apparatus that includes the divide-by PLL circuit and the phase-error tracking circuit. In specific examples, the divide-by PLL circuit and the phase-error tracking circuit are part of a FMCW radar device for detecting objects by radar signals based on the continuous wave signal reflecting from the objects.

The divide-by PLL circuit generates a continuous wave signal that sweeps over a frequency range in response to a divider feedback signal and a reference signal. The divide-by PLL circuit can include a sweep frequency signal generator, a sigma delta modulator, and a divider circuit. The sweep frequency signal generator modulates a wave signal. For example, sweep frequency signal generator modulates a wave signal to generate an FMCW radar signal. The modulated wave signal is provided to the sigma delta modulator, which drives the divider circuit. The output of the divider circuit can be used as the divider feedback signal. The divide-by PLL circuit further includes a phase frequency detector (PFD) to respond to the reference signal and to the divider feedback signal and a charge pump that responds to directional signals (e.g., up signal and a down signal) provided or derived from the PFD for indicating a frequency direction in a path of the divide-by PLL circuit. The output of the charge pump drives a voltage controlled oscillator (VCO). The VCO responds to the charge pump by generating an FMCW radar signal which oscillates at a rate equal to the frequency of the reference signal multiplied by a signal output by the sweep frequency signal generator.

The phase-error tracking circuit defines a phase-error window in which the divide-by PLL circuit is to lock based on a slope associated with a rate of change of the frequency range, and indicates whether a phase error between the divider feedback signal and the reference signal coincides with the phase-error window. As used herein, the phase error coinciding with the phase-error window includes or refers to the phase error being within the phase-error window. The phase-error tracking circuit detects the phase-error window based on a slope of the FMCW signal. The phase-error tracking circuit can sense the slope associated with the rate of change of the frequency range and/or the phase-error window can be insensitive to whether respective duty cycles of the divider feedback signal and the reference signal coincide. The phase-error window and phase offset are thereby programmable. The apparatus can further include a configuration circuit to program at least one limit defining an extremity of the phase-error window.

The phase-error tracking circuit can be reset using various signals. For example, the sweep frequency signal generator further generates a control signal (e.g., force-reset) based on the FMCW signal. The phase-error tracking circuit uses the control signal as a circuit reset or restart signal. In other embodiments and/or in addition, the phase-error tracking circuit uses the directional signal from the PFD for providing a signal which corresponds to causing reset circuitry to reset the phase-error tracking circuit. More specifically, the signal provided from the PFD to the phase-error tracking circuit is used to provide timing of the phase-error tracking circuit dividers and delay line.

Other specific example embodiments are directed to an apparatus for use with a radar system having a divide-by PLL circuit. The apparatus includes phase-error circuitry to define a phase-error window in which the PLL circuit is to lock based on a slope associated with a rate of change of the frequency range and circuitry to indicate whether a phase error between the divider feedback signal and the reference signal coincides with the phase-error window. The phase-error circuitry and the circuitry can be integrated together forming lock detection logic.

The circuitry can, for example, indicate a phase difference between the reference and divider feedback signals, the phase difference being proportional to an intended frequency rate of change of an FMCW signal output from the PLL circuit. Further, the circuitry can indicate if a phase difference between the reference and divider feedback signals coincides with the phase-error window. The phase-error circuitry can include delay circuitry to define the phase-error window in response to the divider feedback signal and the reference signal provided from the divide-by PLL circuit.

In other specific example embodiments, the apparatus further includes the above-described divide-by PLL circuit. Further and/or alternatively, the apparatus includes reset circuitry to receive the divider feedback signal and the reference signal and an indication of a frequency direction in a path of the divide-by PLL circuit, and in response, to reset the phase-error circuitry.

A number of embodiments are directed to methods of using the above-described apparatuses, as further described herein.

Turning now to the figures, FIG. 1 illustrates an example apparatus for phase-tracking a PLL circuit, in accordance with various embodiments. The apparatus 100 includes a divide-by PLL circuit 104 and a phase-error tracking circuit 102. In various embodiments, the divide-by PLL circuit 104 and the phase-error tracking circuit 102 are part of an FMCW radar device for detecting objects by radar signals based on the continuous wave signal reflecting from the objects. The continuous wave signal can include a FMCW signal.

The divide-by PLL circuit 104 generates an output signal that has a phase related to a phase of the input signal. PLL circuits, in general, include a VCO 112 and a phase detector in a path or loop. The VCO 112 generates a periodic signal and the phase detector compares the phase of the periodic signal with the phase of an input periodic signal, and adjusts the VCO 112 to keep the phase matched. The phase detector can include a PFD 106 and a charge pump 108. The PFD 106 receives a reference signal and a divider feedback signal and compares the frequency of the signals. In response to the comparison, the PFD 106 generates a directional signal that is indicative of a frequency direction in the path, such as up and down signals. The directional signal is provided to the charge pump 108 for control of voltage across a capacitor of the charge pump 108 such that the charge of the capacitor is proportional to the phase difference of the reference and divider feedback signals. The charge pump 108 responds to the directional signal (e.g., the up signal or down signal) by indicating the frequency direction in the path. For example, when the slope of the chirp is positive, the charge pump 108 injects a positive current, in average, to the filter circuit 110 which increases an output voltage of the filter circuit 110 (Vtune). The increase of Vtune can subsequently cause an increase frequency of the VCO 112. The charge pump 108 pumps current continuously responsive to the phase error at the input of the PFD 106 being positive. Conversely, when the chirp frequency is negative, the phase error is negative. The output of the charge pump 108 is coupled to the VCO 112 through the filter circuit 110 to generate a signal having an output signal frequency. The filter circuit 110 integrates or averages the signal received from the charge pump 108 and provides a control voltage to the VCO 112, thereby increasing or decreasing the frequency of the output signal osc.

The divide-by PLL circuit 104 can include a digital circuit that creates the FMCW value or signal. In the specific embodiment illustrated by FIG. 1, the divide-by PLL circuit 104 includes a sweep frequency signal generator 118 that modules a wave signal and/or generates a signal output, such as a FMCW radar signal. The divide-by PLL circuit 104 generates a continuous wave that sweeps over a frequency range in response to a divider feedback signal, e.g., div, and to a reference signal, e.g., ref. The divide-by PLL circuit 104 compares the phase of the reference signal to the phase of the divider feedback signal.

The following is an example operation of the divide-by PLL circuit 104. The frequency of the output signal (osc) generated by the VCO 112 is sent through a feedback loop or path to the PFD 106 through the divider circuit 114. The divider circuit 114 divides the output signal by a divisor generated by the sweep frequency signal generator 118 and modulator circuit. The sweep frequency signal generator 118 creates a signal output. The signal output of the sweep frequency signal generator 118 may include a FMCW signal indicative of a fractional input and based on the reference signal. This FMCW signal is provided to the modulator circuit, such as the illustrated Sigma-Delta (SD) modulator circuit 116 that drives a divider circuit 114. The divider circuit 114 responds to the SD modulator circuit 116 and an output of the VCO 112, e.g., osc, to provide the divider feedback signal. The divider feedback signal is fed back to the PFD 106 and also used to clock the SD modulator circuit 116 and the sweep frequency signal generator 118. The PFD 106 responds to a reference signal and the divider feedback signal by providing the directional signal to the charge pump 108. The charge pump 108 responds to the directional signal to provide an indication of the frequency direction in the path, such as injecting current into the path. The output of the charge pump 108 is provided to the filter circuit 110, which filters the output. As described above, the combination of the PFD 106 and the charge pump 108 can include a phase detector with the filter circuit 110 being used to filter the output from the phase detector. The VCO 112 responds to the charge pump 108 by generating an FMCW signal which oscillates at a rate of frequency of the reference signal multiplied by the signal output by the sweep frequency signal generator 118. Although not illustrated, control circuitry can input the reference signal to the PFD 106 and the sweep frequency signal generator 118.

In many radar applications, a lower part of the slope is used to extract range information. The higher part of the slope can be used as a reset in which no range information is extracted. This reset time, in accordance with various embodiments, is not zero and can result in a (larger) phase-error in which the divide-by PLL circuit 104 is to lock that is arbitrary. The phase-error tracking circuit 102 can be used to define a phase-error window in which the divide-by PLL circuit 104 is to lock based on a slope associated with a rate of change of the frequency range, and indicate whether a phase error between the divider feedback signal and the reference signal coincides with the phase-error window. More specifically, phase-error tracking circuit 102 senses the slope associated with a rate of change of the frequency range over which the continuous wave sweeps. The phase-error window is insensitive to whether respective duty cycles of the divider feedback signal and the reference signal coincide. Additionally, the size of the phase-error window and the range of the phases are configurable and programmable. For example, the apparatus 100 further includes a configuration circuit to program at least one limit defining an extremity of the phase-error window. In this way, the maximum allowed phase error can be programmed. In other embodiments and/or in addition, the phase-error tracking circuit 102 can detect a signal with an offset. The offset is programmable, depending on the chirp slope.

In accordance with various embodiments, the phase-error tracking circuit 102 includes phase-error circuitry and circuitry to indicate whether the phase error between the divider feedback signal and the reference signal coincides with the phase-error window. The phase-error circuitry defines the phase-error window. The phase-error circuitry can include delay circuitry, such as a plurality of delay elements, that receives the reference signal and the divider feedback signal, and based on a delay of the signals, defines the phase-error window. The phase-error circuitry and circuitry can be integrated together to form lock detection logic.

The phase-error tracking circuit 102 can reset the phase-error window, in a number of embodiments. The reset may be based on a control signal provided by the sweep frequency signal generator 118 and/or the directional signal from the PFD 106. For example, the sweep frequency signal generator 118 generates a control signal, e.g., force_reset, and provides the same to the phase-error tracking circuit 102 which uses the control signal as a circuit reset or restart. The control signal may be provided in response to the FMCW radar signal going up. Additionally, the phase-error tracking circuit 102 can use the directional signal provided from the PFD 106 for providing a signal for use by or to cause reset circuitry to reset the phase-error tracking circuit. In such embodiments, the phase-error tracking circuit 102 further includes the reset circuitry as further illustrated herein. As described above, the signal from the PFD 106 indicates to the phase-error track circuit 102, timing/when it is effective to reset internal dividers. This signal provides alignment for the reset.

In specific examples, the phase-error tracking circuit 102 has the inputs of the reference signal and the divider feedback signal that are delayed by the delay circuitry, such as the two delay elements further illustrated herein. If the reference signal (ref) is delayed by $2d$ and the divider feedback signal is delayed by d, a phase-error window of [−d, d] is defined. In this example, the reference signal creates two time stamps for the divider feedback signal. If the divider feedback signal is within the window [−d, d], the unlock signal is not trigged or a signal indicative of the PLL being locked is output (e.g., a value of 0). If the divider feedback signal is out of the window, due to the PLL circuit not being locked, the unlock signal is trigged and output (e.g., a value of 1). In this particular example, the offset of the window is zero (−d+d) and the width of the window of the window is 2d (d+d).

Figure 2:
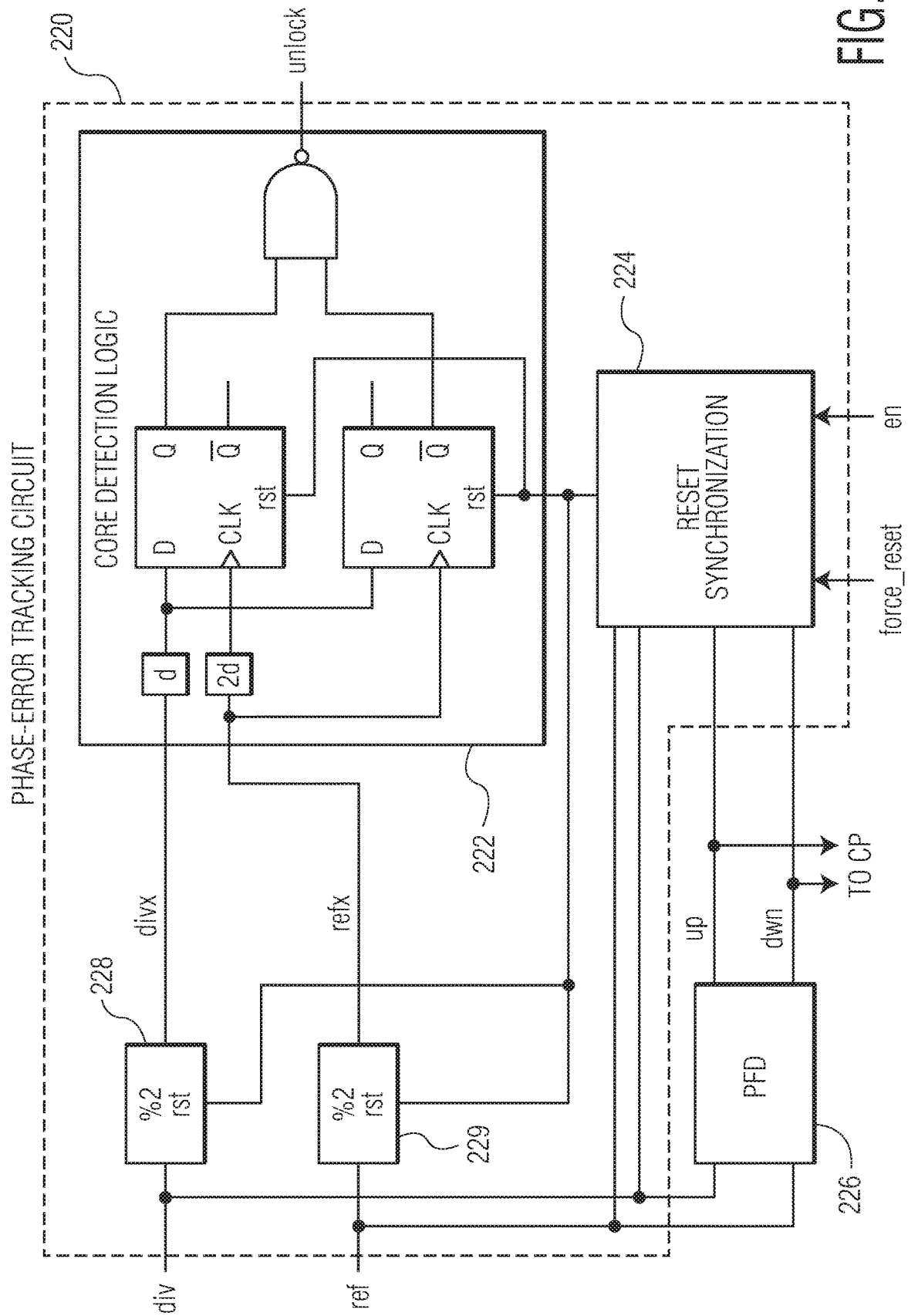
FIG. 2 illustrates an example apparatus for phase-error tracking a PLL circuit, in accordance with various embodiments.

FIG. 2 illustrates an example apparatus for phase-tracking a PLL circuit, in accordance with various embodiments. The apparatus is for use with a radar system having a divide-by PLL circuit and/or includes the divide-by PLL circuit as previous described by FIG. 1 and as illustrated by the PFD 226.

The apparatus includes a phase-error tracking circuit 220 as previously described. As illustrated, the phase-error tracking circuit 220 includes core detection logic 222. The core detection logic 222 can include the previously described phase-error circuitry and circuitry. The phase-error circuitry, which includes the illustrated delay elements (d, 2d), defines a phase-error window in which the divide-by PLL circuit is to lock based on a slope associated with a rate of change of the frequency range. The circuitry indicates whether a phase error between the divider feedback signal and the reference signal coincides with the phase-error window. More specifically, the circuitry indicates a phase difference (e.g., phi_error) between the reference and divider feedback signals, the phase difference being proportional to an intended frequency rate of change of an FMCW signal output from the PLL circuit. The circuitry can indicate if a phase difference between the reference and divider feedback signals (phi_error) coincides with the phase-error window.

The phase-error tracking circuit 220 can additionally include by-two dividers 228, 229, and/or reset circuitry 224. The reset circuitry 224 receives the divider feedback signal and the reference signal and an indication of a frequency direction in a path of the divide-by PLL circuit (e.g., up/down signal), and in response, resets the phase-error tracking circuit 220, such as resetting the phase error circuitry. Defining the FMCW signal, as previously described, also defines the phase-error window, where it is possible to decide how stringent limits are set. In case limits are set too stringent for the up slope, the phase-error tracking circuit 220 can indicate an un-lock condition during the reset (e.g., the reset has higher slope and hence bigger phase difference). To overcome or mitigate this, during the reset, the phase-error tracking circuit 220 is cleared by digital control provided by the reset circuitry 224. The reset circuitry 224 can have inputs of the reference and divider feedback signals (e.g., ref and div), the outputs of the PFD 226 (e.g., up and dwn), and the signal force_reset that are used to clear the error of the phase-error tracking circuit 220.

Figure 4:
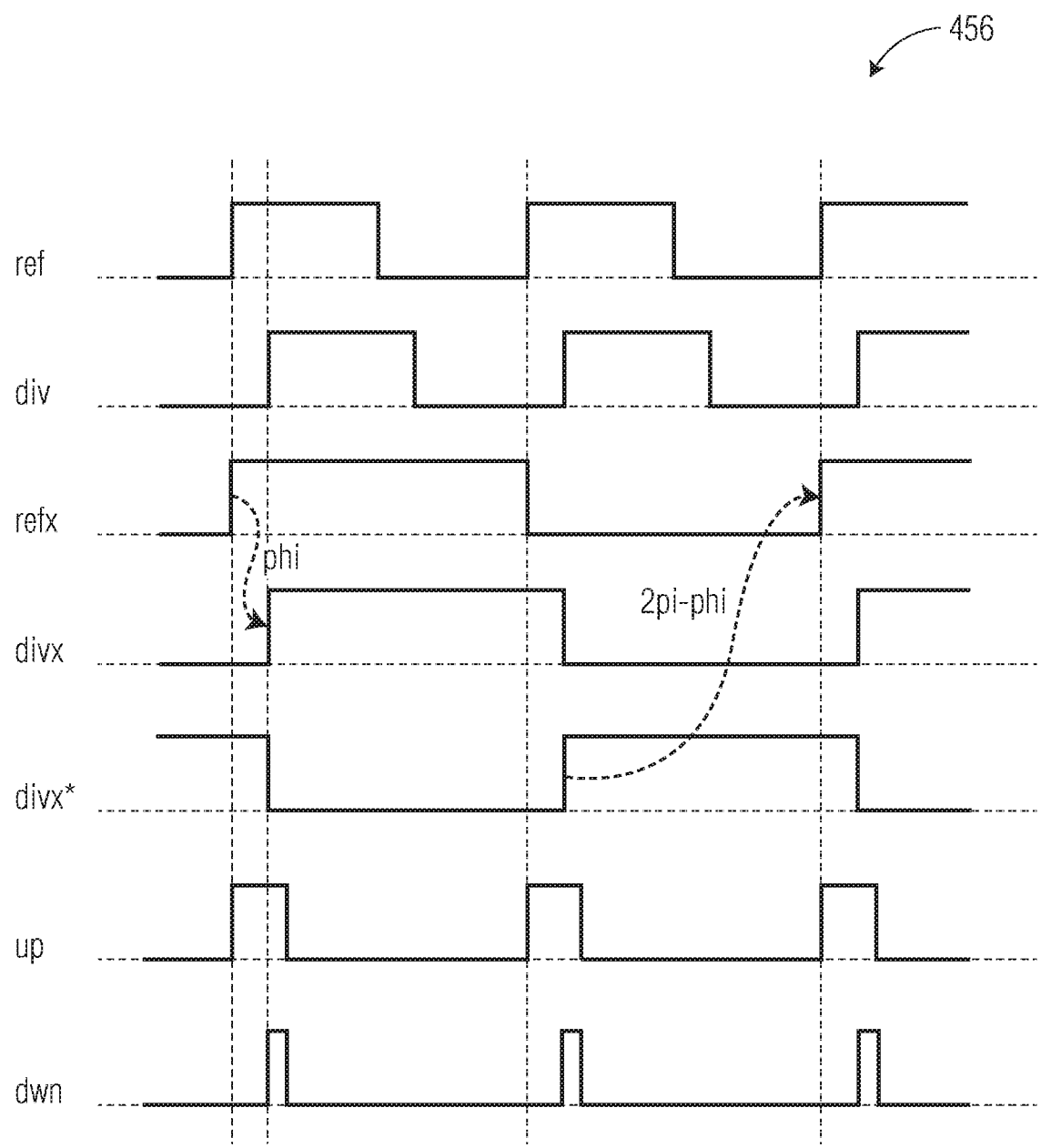
FIG. 4 illustrates an example timing diagram of by-two divider outputs, in accordance with various embodiments.

A function of the by-two dividers 228, 229 is to extend the dynamic range of the core detection logic 222 and make the dynamic range independent of the duty cycle of the input signal. Signals refx and divx have both twice the period of the input signal and a close to fifty percent duty cycle. The introduction of the by-two dividers 228, 229 creates an ambiguity. When the signal div, or ref, changes states or toggles, there are two possible states for signal divx, as further illustrated by FIG. 4. More specifically, FIG. 4 shows a PLL circuit where the ref signal is leading the div signal, this can be appreciated by fact that signal up is wider than signal dwn. Both signals divx and divx* are possible outputs of the by-two dividers 228, 229 but only divx is valid.

A function of the reset circuitry 224 is two avoid or mitigate the dividers 228, 229 in the right moment. The by-two dividers 228, 229 can be reset in any moment except in the time between the positive edge of the leading signal (ref in the example in the figure) and the lagging signal (div in the figure). The PFD output signals up and dwn can be used to that purpose.

Figure 3A:
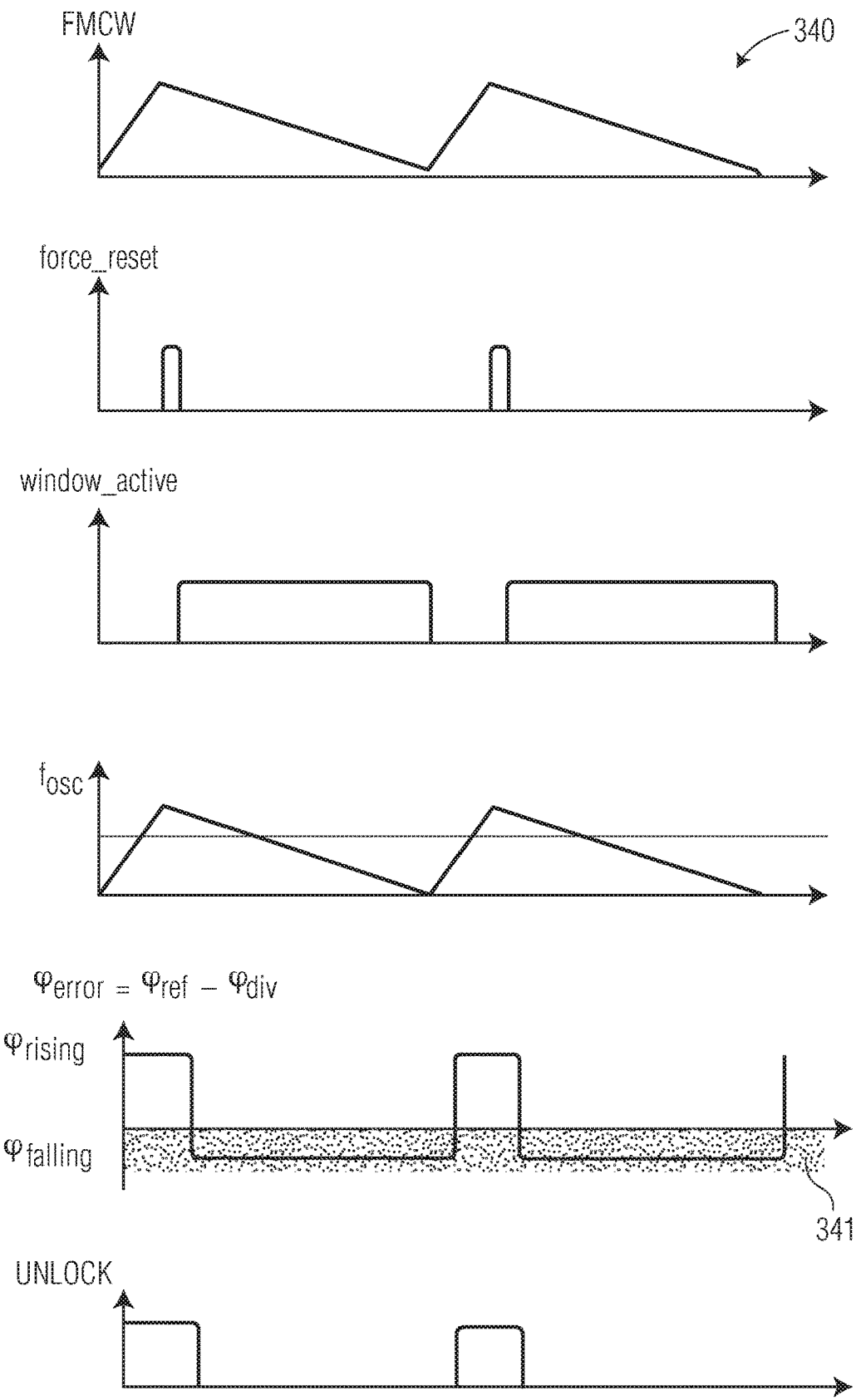
FIGS. 3A-3B illustrate example timing diagrams for an apparatus, in accordance with various embodiments.
Figure 3B:
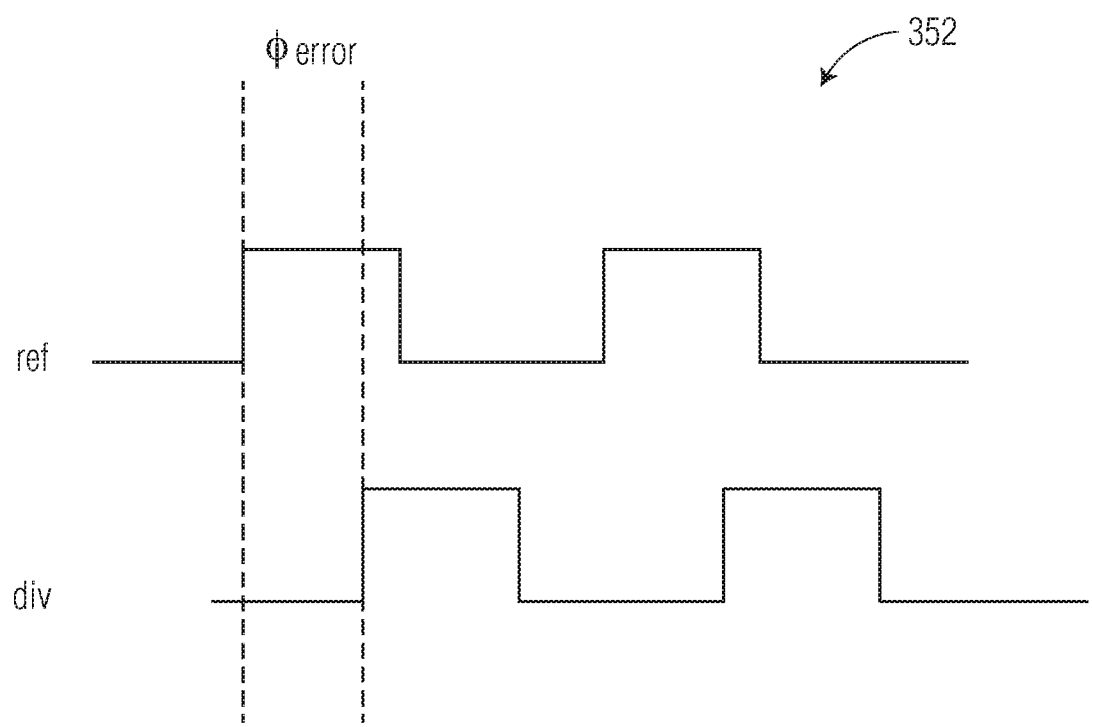

FIGS. 3A-3B illustrate example timing diagrams for an apparatus, in accordance with various embodiments as discussed herein. The timing diagram 340 of FIG. 3A illustrates the FMCW signal, the force_reset signal, the window active signal, the frequency of the output signal of the VCO ($f_{osc}$), the phase error (phi_error or $\varphi_{error}$), and the unlock signal. As previously described, the FMCW signal and the force_reset signal may be outputs of a sweep frequency signal generator. The input of the PLL circuit is the reference signal with a frequency $f_{ref}$ and the output is the signal from the VCO (e.g., osc), that is at a frequency of $f_{osc}$. The PLL circuit is to output a frequency of $f_{osc}=N_{FMCW} \times f_{ref}$. If $f_{ref}$ is a fixed value, such as 480 Megahertz (MHz), than $f_{osc}$ appears as FMCW.

In many examples, $f_{osc}$ creates or results in a phase difference between the reference signal and the divider feedback signal, which is shown as the $\varphi_{error}$ in FIG. 3A. As previously described, in connection with the above-discussed embodiments, the $\varphi_{error}$ may be proportional to the intended slope of $f_{osc}$ and may be a measure of distance between the edges of the two signals. The previously-described phase-error window 341 is the $\varphi_{error}$ that is between a margin. The phase-error being within the phase-error window 341 to indicate that the PLL circuit is operating correctly and is a measure of the quality of signal. Additionally shown is the unlock signal, e.g., the output signal of the phase-error detection circuit, when the PLL circuit is correctly operating. The phase-error detection circuit is triggered, as illustrated, by the ramp signal going up, as shown by the FMCW and $f_{osc}$ signals, even when the PLL circuit is operating correctly or normally. This is why the force_reset signal is used to reinitiate the phase-error detection circuit. The window active signal is further described herein. In accordance with various embodiments, the phase-error tracking circuit (e.g., lock detector) is ignored during the high part of the slope chirp. Right before the low slope chirp begins, a force reset occurs to allow for the dividers with the phase-error tracking circuit to be initialized properly.

FIG. 3B illustrates an example timing diagram 352 that shows an example of the phase error between the between the reference signal and the divider feedback signal.

FIG. 4 illustrates an example timing diagram of by-two divider outputs, in accordance with various embodiments. As previously illustrated in FIG. 2, the phase-error tracking circuit can include divider circuits, such by-two dividers. The timing diagram 456 illustrates the by-two divider outputs (refx, divx, and divx*) as compared to the reference signal (ref) and the divider feedback signal (div), as well as the directional signals from the PFD (up, dwn).

As previously described, signals refx and divx have both twice the period of the input signal and a close to fifty percent duty cycle. The introduction of the dividers creates an ambiguity, when the signal div, or ref, changes states or toggles there are two possible states for signal divx, as illustrated by divx and divx*. This shows a PLL where the ref signal is leading the div signal, this can be appreciated by fact that signal up is wider than signal dwn. Both signals divx and divx* are possible outputs of the by-two divider circuit but only divx is valid. The reset circuit is used to reset the by-two dividers in any moment except the time between the positive edge of the leading signal, which is ref in this example, and the lagging signal, which is div is this example.

Figure 5:
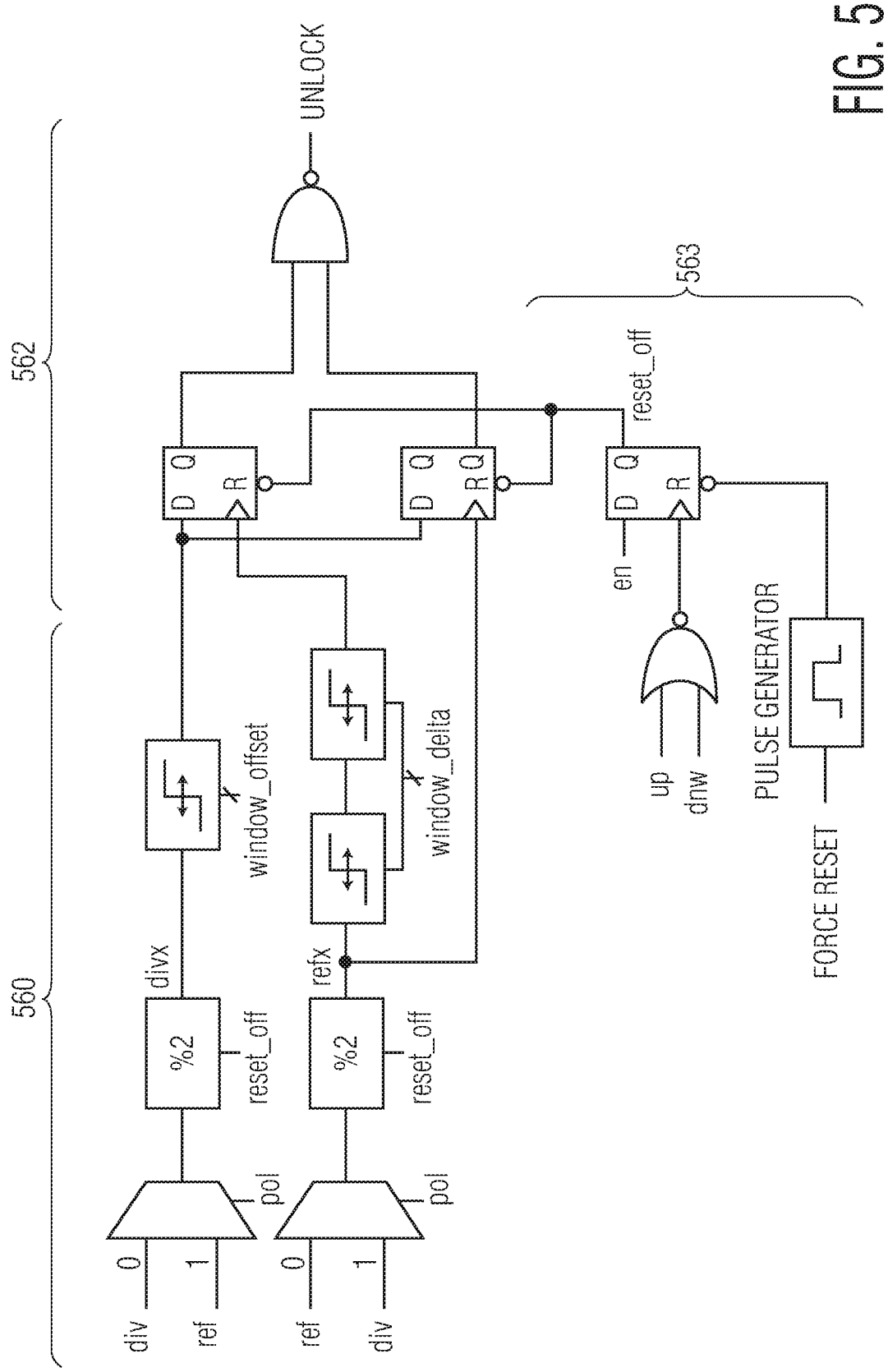
FIG. 5 illustrates an example apparatus including a phase-error tracking circuit, in accordance with various embodiments.

FIG. 5 illustrates an example apparatus including a phase-error tracking circuit, in accordance with various embodiments. More specifically, the phase-error tracking circuit includes the previously described phase-error circuitry 560 that define the phase-error window and circuitry 562 that indicates whether the phase error between the divider feedback signal and the reference signal coincides with the phase-error window. The phase-error circuitry 560 and/or part thereof and the circuitry 562 can be integrated together to form lock detection logic. The phase-error circuitry 560 can include the delay circuits and the by-two dividers, as well as multiplexers that provide an input signal to the by-two dividers using the inputs of the divider feedback signal and the reference signal. The phase-error tracking circuit additionally includes reset circuitry 563, as previously described.

In a specific embodiment, when the signal force_reset is high (or in response thereto), a small pulse is created by the reset circuitry 563 via a pulse generator that causes a general reset of the flops. After the output of the pulse generator gets low, the system waits for directional signals (up and dwn) to get down before releasing the reset of the delay signal flip-flops (reset_dff) guaranteeing the correct phase of the by-two dividers.

FIG. 5 more specifically illustrates an example implementation of the delay using three equal delay element cells. The resulting window offset and window width are:

$$w\_width=2*d2*delay\_lsb+2*delay\_min$$

$$w\_offset=(d2-d1)*delay\_lsb+delay\_min,$$

where delay_lsb is the least significant bit (LSB) step of the delay line, delay_min is the minimum delay of the unity cell element and d1 and d2 are the programming line. The w offset is limited to [−d1+delay_min, d2+delay_min].

As described above, the phase-error circuit can additionally include multiplexers that invert the polarity of the phase-error circuit, that in case w offset cannot be made negative enough.

Figure 6:
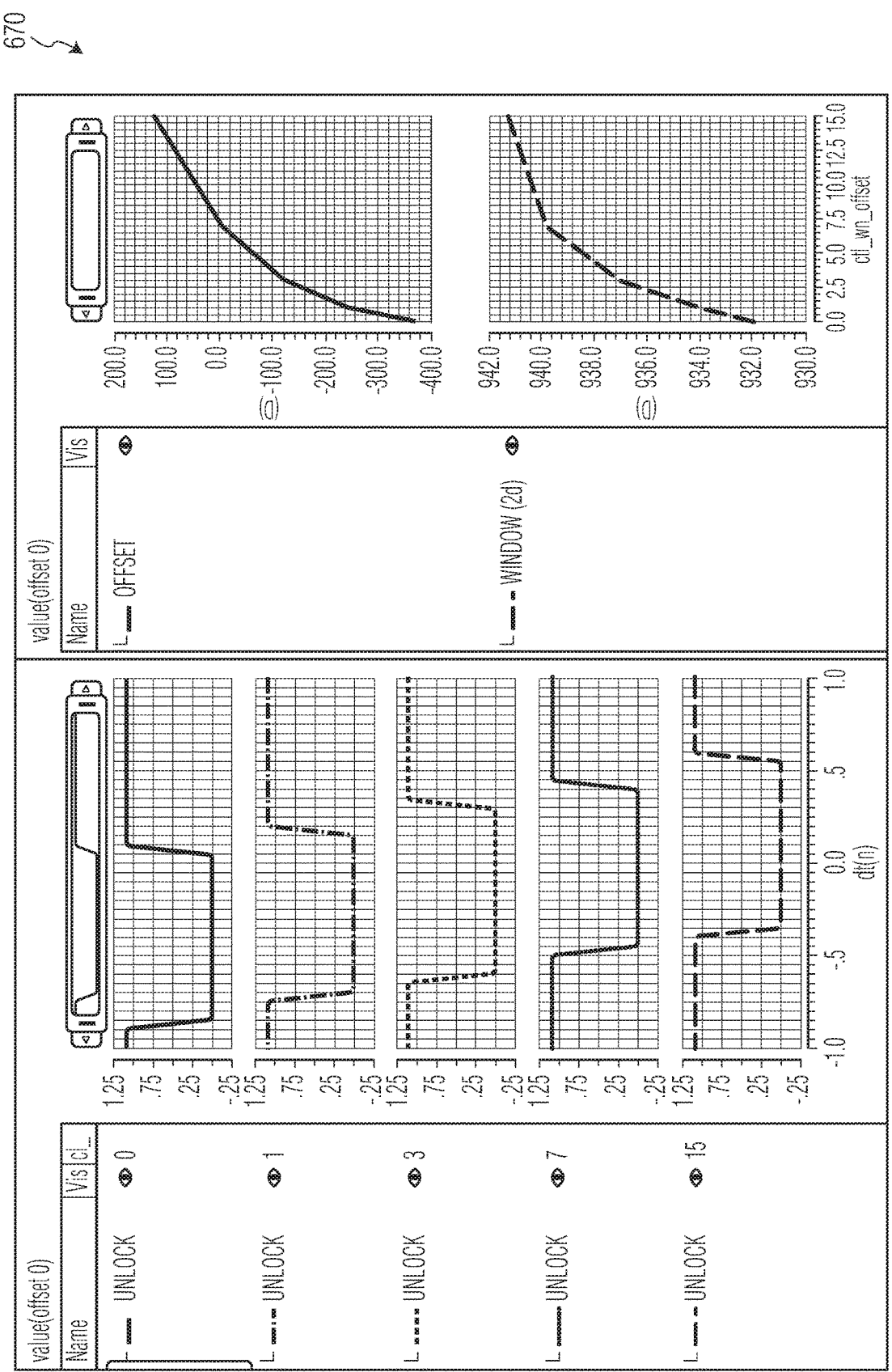
FIG. 6 illustrates an example of an apparatus and resulting phase-error windows, in accordance with various embodiments.

FIG. 6 illustrates an example of an apparatus and resulting phase-error windows, in accordance with various embodiments. More specifically, FIG. 6 is a graph 670 showing example results of using a phase-error tracking circuit, such as the related circuitry exemplified in the above discussion, to determine a phase-error window, where the offset is moved to accommodate different phase offsets.

FIG. 7 illustrates an example timing diagram for resetting the phase-tracking circuit, in accordance with various embodiments. More specifically, FIG. 7 is timing diagram 780 showing example waveforms of the phase-error tracking circuit in a FMCW radar. The window active signal indicates when the radar signal is valid. The window active signal may be used as the enable signal of the phase-error tracking circuit in this form, as is shown by FIG. 2. When window active is low, the phase-error tracking circuit is reset constantly and/or every time that the cycle is finished (e.g., and ref and div are low). When or in response to the window active toggling high, the phase-error tracking circuit starts detecting errors only during the portion of the chirp generator that is valid. This is communicated to a functional safety unit, a global unit that monitors all sensors during window active.

In accordance with various embodiments, delay cells are built in a novel way to be psychomotor vigilance test (PVT) insensitive. Each delay cell is built with current starved inverters with both p-type metal-oxide-semiconductor (PMOS) current sources and n-type metal-oxide-semiconductor (NMOS) current sinks at each inverter stage. Current source/sinks in each inverters are biased from PVT independent currents generating block. The delay in each inverter stage is proportional to output impedance and capacitance associated at the output node. Output impedance of the delay cell is proportional to the bias mirror current. Therefore delay remains fairly constant over PVT. Accuracy of the delay units are subject to design quality, power consumption, and area allowed for the delay cells.

In accordance with various embodiments, the phase-error tracking circuit can sense deviation of the slope (e.g., the FMCW slope), in response to the phase-error window being accurate (e.g., delay cells design). This can be used for safety monitoring in radar systems.

Figure 8A:
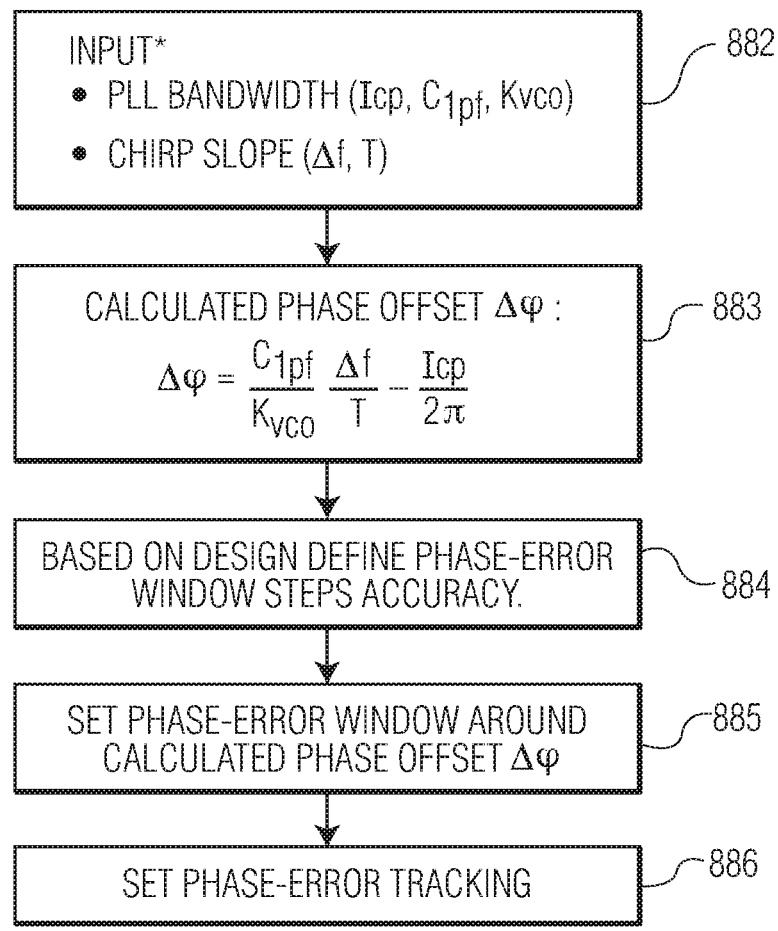
FIGS. 8A-8B illustrate an example flow chart for setting the phase-error tracking, in accordance with various embodiments.
Figure 8B:
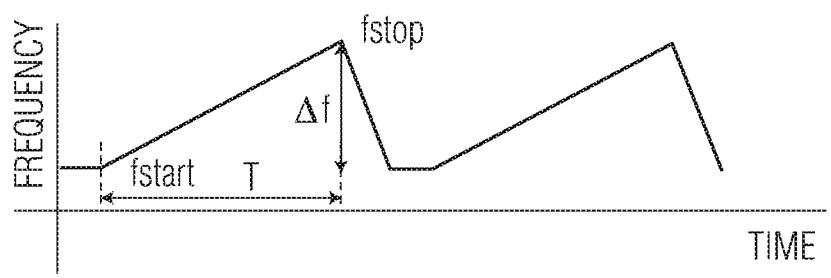

FIGS. 8A-8B illustrate an example flow chart for setting the phase-error tracking, in accordance with various embodiments. The flow chart illustrated by FIG. 8A shows an example of setting the parameters of the phase-error tracking circuit (e.g., window, polarity, etc.) from the slope of the chirp for initializing the tracking. At 882, the PLL bandwidth and slope are input as parameters. The PLL bandwidth can be defined as a function of Icp, $C_{lpf}$, and Kvco. The (chirp) slope can be defined as a function of $\Delta f$, T, where $\Delta f$ is fstop-fstart of the chirp in a chirp sequence. At 883, the phase offset is calculated. For example, the phase offset can be calculated based on:

$$\Delta \varphi = \frac{C_{lfp}}{K_{vco}} \frac{\Delta f}{T} - \frac{I_{cp}}{2\pi}$$

although embodiments are not so limited. Depending on the design, at 884, the phase error is defined according to a window step accuracy. And, at 885, the phase error window is set around the calculated phase offset, which leads to the beginning of the phase-error tracking, at 886.

FIG. 8B illustrates an example chirp of a chirp sequence used for setting parameters in the flow chart of FIG. 8A to exemplify, for example, a slope of over which the FWCW signal sweeps as described in the timing diagram 340 of FIG. 3A as well as the timing diagram 780 of FIG. 7.

Various embodiments are directed to the above-described apparatuses in an automotive radar system where the PLL circuit is used to generate frequency chirps. Frequency chirps are translated, after post processing, to a distance measurement in the automotive radar system. The phase-error tracking circuit can detect if a PLL circuit locks to a phase different than zero. The phase-error tracking circuit has an enhanced dynamic range due to the by-two dividers used at the input and is also insensible to the duty cycle of the input signal. The phase-error tracking circuit is suitable to be used in a PLL circuit for FMCW modulation and allows to set a small window around the phase value the PLL locks to.

A number of embodiment are directed to methods of using the above described apparatuses. An example method is directed to generating a continuous wave radar signal. The method includes in a divide-by PLL circuit, generating a continuous wave signal that sweeps over a frequency range in response to a divider feedback signal and to a reference signal. The method further includes tracking a phase-error between the divider feedback signal and the reference signal by defining a phase-error window in which the PLL circuit is to lock based on a slope associated with a rate of change of the frequency range, and by indicating whether a phase error between the divider signal and the reference signal coincides with the phase-error window. The step of phase-error tracking is to sense the slope associated with a rate of change of the frequency range.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 102 and 220 of FIGS. 1-2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches described herein. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the phase-error tracking circuit 220 illustrated by FIG. 2 can be implemented as the phase-error tracking circuit 102 illustrated by FIG. 1 As another example, phase-error tracking circuit illustrated by FIG. 5 can be implemented as the phase-error tracking circuit 102 illustrated by FIG. 1. Such modifications do not depart from the true spirit and scope of various aspects of the disclosure, including aspects set forth in the claims.

What is claimed is:

1. An apparatus comprising:
a divide-by phase locked loop (PLL) circuit to generate a continuous wave signal that sweeps over a frequency range in response to a divider feedback signal and to a reference signal; and
a phase-error tracking circuit to define a phase-error window in which the divide-by PLL circuit is to lock based on a slope associated with a rate of change of the frequency range, and indicate whether a phase error between the divider feedback signal and the reference signal coincides with the phase-error window.

2. The apparatus of claim 1, wherein the phase-error tracking circuit is to sense the slope associated with a rate of change of the frequency range.

3. The apparatus of claim 1, further including a configuration circuit to program at least one limit defining an extremity of the phase-error window.

4. The apparatus of claim 1, wherein the phase-error window is insensitive to whether respective duty cycles of the divider feedback signal and the reference signal coincide.

5. The apparatus of claim 1, wherein the divide-by PLL circuit and the phase-error tracking circuit are part of a frequency-modulated continuous wave (FMCW) radar device for detecting objects by radar signals based on the continuous wave signal reflecting from the objects.

6. The apparatus of claim 5, wherein the divide-by PLL circuit includes a divider circuit, a sigma delta modulator to drive the divider circuit, a sweep frequency signal generator to generate a frequency-modulated continuous wave (FMCW) radar signal.

7. The apparatus of claim 1, wherein the divide-by PLL circuit includes a phase frequency detector (PFD) to respond to the reference signal and to the divider feedback signal and a charge pump that responds to an up signal and a down signal provided or derived from the PFD for indicating a frequency direction in a path of the divide-by PLL circuit.

8. The apparatus of claim 1, wherein the divide-by PLL circuit includes a sweep frequency signal generator to generate a frequency-modulated continuous wave (FMCW) radar signal and a control signal, and wherein the phase-error tracking circuit is to use the control signal as a circuit reset or restart signal.

9. The apparatus of claim 1, wherein the divide-by PLL circuit includes a charge pump that responds to a direction signal for indicating a frequency direction in a path of the divide-by PLL circuit, and wherein the phase-error tracking circuit is to use the direction signal for providing a signal which corresponds to a higher portion of the chirp slope, and for causing reset circuitry to reset the phase-error tracking circuit.

10. The apparatus of claim 1, wherein the divide-by PLL circuit includes a sweep frequency signal generator to modulate the continuous wave signal, and further includes a charge pump and a voltage controlled oscillator to respond to the charge pump by generating a frequency-modulated continuous wave (FMCW) radar signal which oscillates at a rate equal to the frequency of the reference signal multiplied by a signal output by the sweep frequency signal generator.

11. The apparatus of claim 1, wherein the phase-error tracking circuit includes:
phase-error circuitry to define the phase-error window, and
circuitry to indicate whether the phase error between the divider feedback signal and the reference signal coincides with the phase-error window.

12. An apparatus for use with a radar system having a divide-by phase locked loop (PLL) circuit to generate a continuous wave signal that sweeps over a frequency range in response to a divider feedback signal and a reference signal, the apparatus comprising:
phase-error circuitry to define a phase-error window in which the divide-by PLL circuit is to lock based on a slope associated with a rate of change of the frequency range, and
an indication circuitry to indicate whether a phase error between the divider feedback signal and the reference signal coincides with the phase-error window.

13. The apparatus of claim 12, further including the divide-by PLL circuit.

14. The apparatus of claim 12, the indication circuitry to indicate a phase difference between the reference and divider feedback signals, the phase difference being proportional to an intended frequency rate of change of a frequency-modulated continuous wave (FMCW) signal output from the divide-by PLL circuit.

15. The apparatus of claim 12, the indication circuitry to indicate if a phase difference between the reference and divider feedback signals coincides with the phase-error window.

16. The apparatus of claim 12, wherein the phase-error circuitry includes delay circuitry is to define the phase-error window in response to the divider feedback signal and the reference signal provided from the divide-by PLL circuit.

17. The apparatus of claim 12, wherein the phase-error circuitry and the indication circuitry are integrated together forming lock detection logic.

18. The apparatus of claim 12, the apparatus further including reset circuitry to receive the divider feedback signal and the reference signal and an indication of a frequency direction in a path of the divide-by PLL circuit, and in response, to reset the phase-error circuitry.

19. A method for generating a continuous wave radar signal, the method comprising:

in a divide-by phase locked loop (PLL) circuit, generate a continuous wave signal that sweeps over a frequency range in response to a divider feedback signal and to a reference signal; and tracking a phase-error between the divider feedback signal and the reference signal by defining a phase-error window in which the PLL circuit is to lock based on a slope associated with a rate of change of the frequency range, and by indicating whether a phase error between the divider feedback signal and the reference signal coincides with the phase-error window.

20. The method of claim 19, wherein the step of phase-error tracking is to sense the slope associated with the rate of change of the frequency range.

\* \* \* \* \*